United States Patent [19]

Nilssen

[11] Patent Number: 5,426,347
[45] Date of Patent: Jun. 20, 1995

[54] LIGHTING SYSTEM WITH EMERGENCY STANDBY FEATURE

[76] Inventor: Ole K. Nilssen, 408 Caesar Dr., Barrington, Ill. 60010

[21] Appl. No.: 220,520

[22] Filed: Mar. 31, 1994

Related U.S. Application Data

[63] Continuation-in-part of Ser. No. 47,944, Apr. 16, 1993, which is a continuation-in-part of Ser. No. 955,229, Oct. 1, 1992, Pat. No. 5,233,270, which is a continuation-in-part of Ser. No. 607,271, Oct. 31, 1990, abandoned, which is a continuation-in-part of Ser. No. 787,692, Oct. 15, 1985, abandoned, which is a continuation of Ser. No. 644,155, Aug. 27, 1984, abandoned, which is a continuation of Ser. No. 555,426, Nov. 23, 1983, abandoned, which is a continuation of Ser. No. 178,107, Aug. 14, 1980, abandoned, which is a continuation-in-part of Ser. No. 62,329, May 17, 1993, which is a continuation of Ser. No. 700,049, May 8, 1991, abandoned, which is a continuation of Ser. No. 489,096, Apr. 27, 1983, abandoned, which is a continuation-in-part of Ser. No. 178,107, Aug. 14, 1980, abandoned.

[51] Int. Cl.$^6$ ............................................. H05B 37/00
[52] U.S. Cl. .................... 315/209 R; 315/86; 315/363; 307/150; 307/157; 361/674; 362/226
[58] Field of Search ............... 315/58, 86, 174, 175, 315/209 R, 291, 363; 361/600, 674, 679, 728, 730; 362/9, 226; 307/149, 150, 151, 154–157

[56] References Cited

U.S. PATENT DOCUMENTS

| | | | |
|---|---|---|---|
| 2,674,701 | 4/1954 | Maseritz | 307/155 |
| 2,910,625 | 10/1959 | Carpenter | 361/35 |
| 3,935,505 | 1/1976 | Spiteri | 315/291 X |
| 4,668,876 | 5/1987 | Skarman | 315/291 X |
| 4,749,908 | 6/1988 | Stifter | 315/86 |
| 5,019,767 | 5/1991 | Shirai et al. | 307/150 X |
| 5,023,522 | 6/1991 | Mansour | 315/291 |
| 5,065,292 | 11/1991 | Aubrey | 362/226 X |
| 5,174,293 | 12/1992 | Hagiwara | 361/730 X |
| 5,233,230 | 8/1993 | Bonar | 307/150 X |
| 5,233,270 | 8/1993 | Nilssen | 315/58 |
| 5,241,449 | 8/1993 | Moeller et al. | 315/51 X |
| 5,343,124 | 8/1994 | Nilssen | 315/224 |
| 5,371,441 | 12/1994 | Nilssen | 361/674 X |

*Primary Examiner*—David Mis

[57] ABSTRACT

A power supply is plugged into an ordinary household electrical outlet and conditionally provides a high frequency current at a power receptacle operative to receive the power plug of an ordinary table lamp; which table lamp has a special fluorescent lamp screwed into its lamp socket. Provided the special fluorescent lamp is indeed screwed into the lamp socket, and provided the lamp'switch is in its ON position, the power supply does in fact supply high frequency current from its power receptacle; which high frequency current powers the special fluorescent lamp at a nominal power level, thereby to provide for high-efficacy luminous output. A storage battery contained within the power supply is kept fully charged by current derived from the power line voltage normally present at the electrical outlet and functions such as to cause high frequency current to be supplied from the output receptacle even if the power line voltage were to be disrupted. To prolong the duration over which the battery can power the fluorescent lamp to a useful light output level, the magnitude of the power provided to the lamp during power failure may be reduced compared with its nominal level.

21 Claims, 4 Drawing Sheets

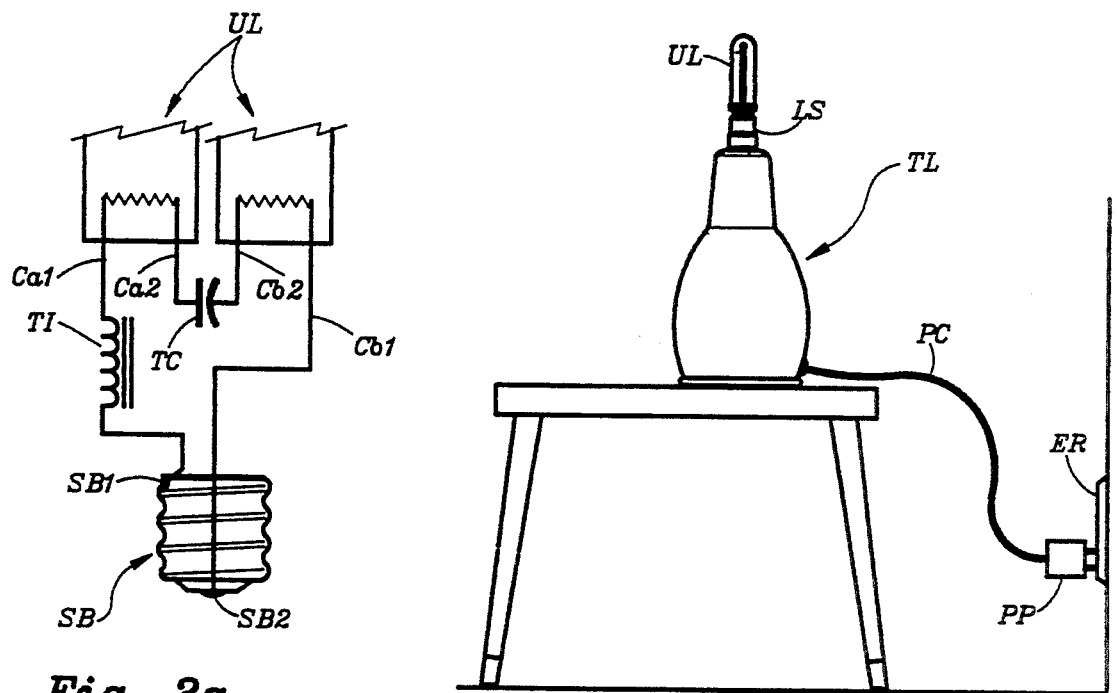
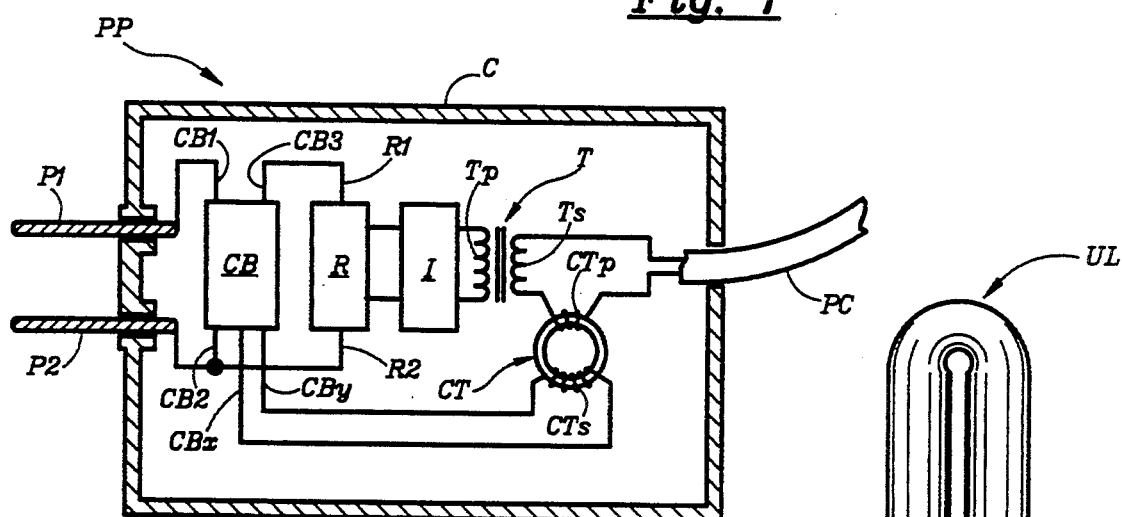
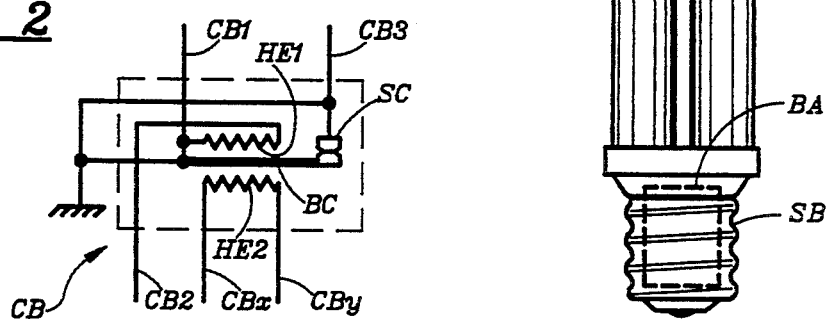
Fig. 3a
Fig. 1
Fig. 2
Fig. 2a
Fig. 3

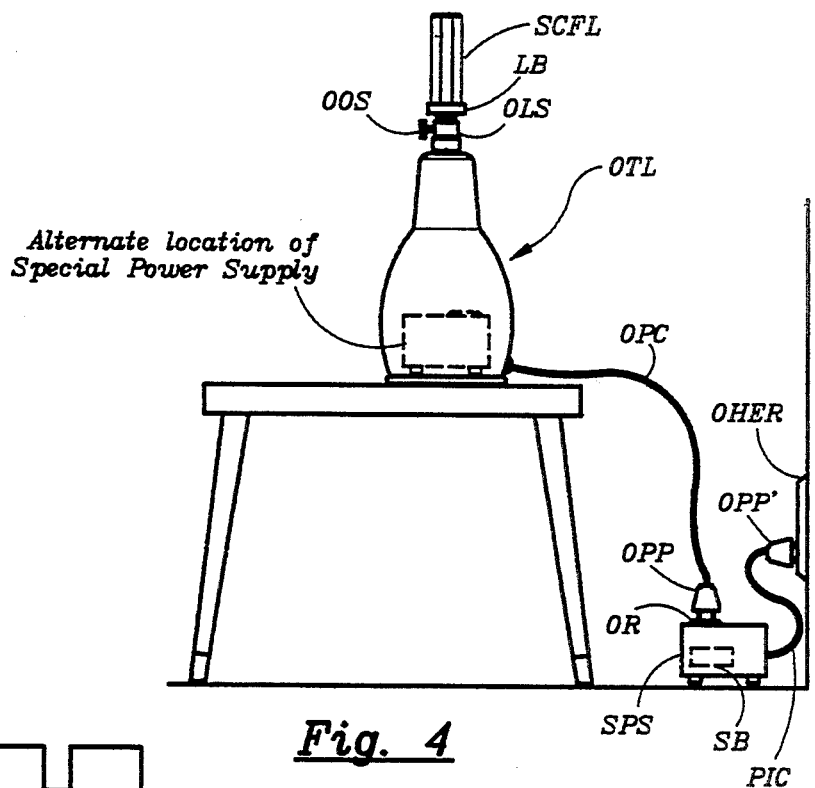
Fig. 4
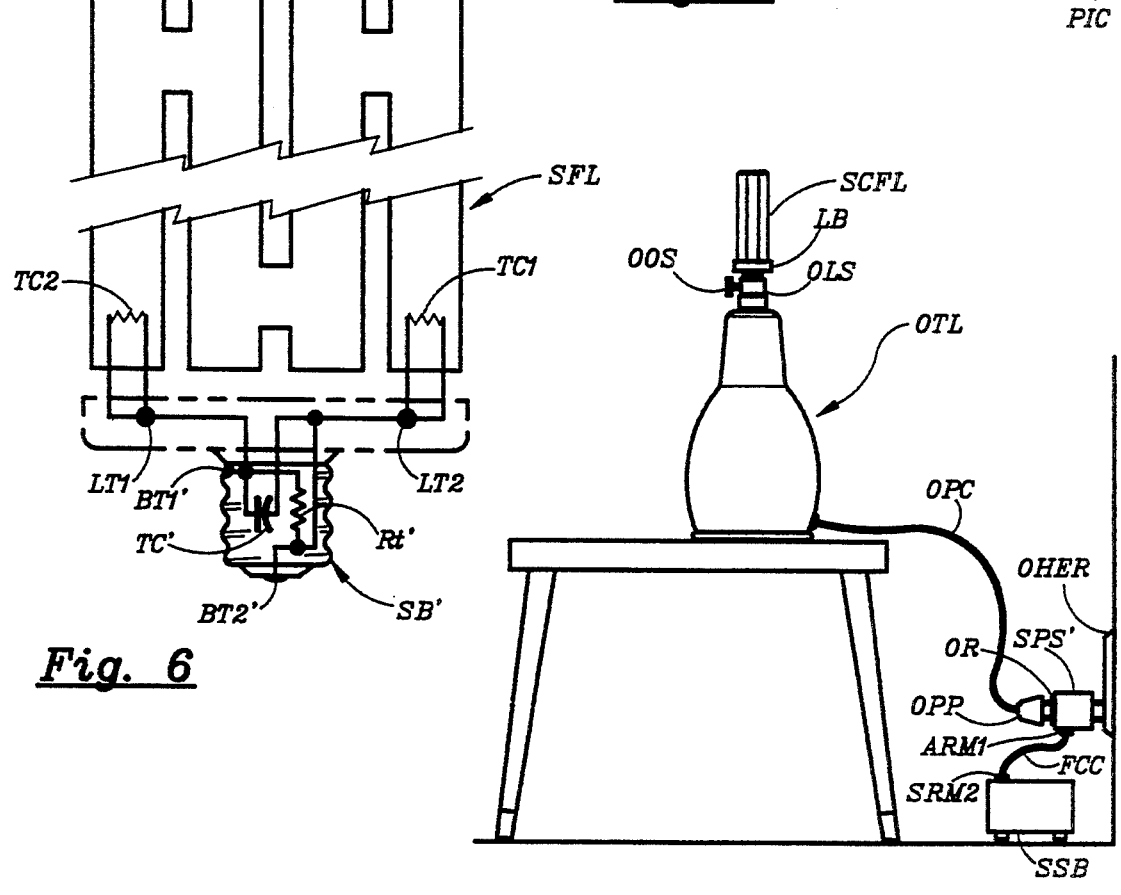
Fig. 6
Fig. 7

LIGHTING SYSTEM WITH EMERGENCY STANDBY FEATURE

RELATED APPLICATIONS

Instant application is a Continuation-in-Part of application Ser. No. 08/947,944 filed Apr. 16, 1993; which is a Continuation-in-Part of Ser. No. 07/955,229 filed Oct. 1, 1992, U.S. Pat. No. 5,233,270; which is a Continuation-in-Part of Ser. No. 07/607,271 filed Oct. 31, 1990, abandoned; which is a Continuation-in-Part of Ser. No. 06/787,692 filed Oct. 15, 1985, abandoned; which is a Continuation of Ser. No. 06/644,155 filed Aug. 27, 1984, abandoned; which is a Continuation of Ser. No. 06/555,426 filed Nov. 23, 1983, abandoned; which is a Continuation of Ser. No. 06/178,107 filed Aug. 14, 1980, abandoned.

Instant application is also a Continuation-in-Part of application Ser. No. 08/062,329 filed May 17, 1993; which is a Continuation of Ser. No. 07/700,049 filed May 8, 1991, abandoned; which is a Continuation of Ser. No. 06/489,096 filed Apr. 27, 1983, abandoned; which is a Continuation-in-Part of Ser. No. 06/178,107 filed Aug. 14, 1980, abandoned.

BACKGROUND OF THE INVENTION

1. Field of the Invention

Instant invention relates to the field of power-line-operated portable (i.e., plug-in) fluorescent lighting products as well as to the field of standby emergency lighting systems.

2. Description of Prior Art

Presently available power-line-operated portable lighting products suitable for use with Edison-based screw-in lamps or lightbulbs (such as so-called table lamps and/or floor lamps) are designed to operate by way of a plug-in power cord and with the full and non-current-limited power-line-voltage applied directly to their lamp sockets. As a result, the lamp sockets in such lighting products represent substantial electric shock hazards, particularly to children; while the power cords of such lighting products represent potential fire hazards, particularly after years' of wear and tear.

Power-line-operated portable lighting products that are substantially free of electric shock hazards and/or fire hazards are not presently available for purchase; nor have such products been described in known literature.

RATIONALE RELATED TO THE INVENTION

A possible resolution of the above-mentioned drawbacks might be that of powering such portable lighting products from low-voltage power-limited transformers rated as so-called Class-2 circuits according to the National Electrical Code. However, by way of conventional transformer technology, such transformers would be far too large and heavy to be commercially acceptable in such applications.

On the other hand, based on high-frequency inverter technology, a Class-2 transformer could be very small and light-of-weight. In fact, for the power levels associated with Class-2 operation, the inverter itself and the associated Class-2 transformer could be made so small as to fit within a modest-size power plug at the end of the power cord feeding the subject lighting product; which now would imply that this complete lighting product, including its power cord, would be subject to the shock and fire hazard protection associated with Class-2 transformers.

Yet, there is a question in regard to the adequacy of the amount of power realistically available from a Class-2 power source—a source that is limited to a maximum output rating of 100 Volt-Ampere. More particularly: is the available power adequate to provide for acceptable levels of light output from subject lighting products?

If only ordinary incandescent lightbulbs were to be used as the source of light in subject portable lighting products, the answer might be "no". However, with the lamp sockets being provided with high-frequency AC voltage (instead of the ordinary 60 Hz AC voltage), there arises the very attractive opportunity of providing for efficiently and inexpensively ballasted screw-in fluorescent lamps—which lamps will provide about four times as much light output for a given power level as can the best of presently available 120 Volt incandescent lamps. That being the case, there is no doubt but that the amount of light that can be provided by subject portable lighting products is adequate for most commercial applications.

(With a power factor of 75%, which is considered reasonably achievable in the present context, as much as 75 Watt can be provided to a lighting product within the Class-2 limitation of 100 Volt-Ampere; which, if using a high-efficiency fluorescent lamp therein, implies an achievable light output of about 7500 Lumen, or the equivalent of the light output from more than six ordinary 75-Watt incandescent lamps.)

Then, it is also noticed that incandescent lamps designed for and powered by a relatively low voltage (30 Volt RMS), as compared with the normal line voltage (120 Volt RMS), will exhibit substantially higher luminous efficacies. For instance, for a 40-Watt incandescent lamp the resulting improvement in efficacy would be about 55%.

All in all, based on the above-identified perceptions and considerations, it appears that power-line-operated Class-2 portable lighting products might indeed constitute attractive and commercially viable products.

SUMMARY OF THE INVENTION

Objects of the Invention

A first object of the present invention is that of providing a power-line-operated portable lighting product that exhibits improved characteristics in respect to electric shock and fire hazards as compared with presently available power-line-operated portable lighting products.

A second object is that of providing a power-line-operated portable lighting product that is capable of receiving and holding lamps or lightbulbs with ordinary Edison-type screw-bases and of powering such lamps with a high-frequency current-limited voltage.

A third object is that of providing a power-line-operated portable lighting product that comprises an inverter-type power supply within its power plug at the end of its power cord, said power supply being operative to supply high-frequency power-limited low-magnitude voltage to the power cord.

A fourth object is that of providing a power-line-operated portable lighting product that is capable of properly powering a high-frequency-ballasted screw-in fluorescent lamps.

A fifth object is that of providing a high-frequency-ballasted screw-in fluorescent lamp, which is a lamp that is adapted for use in a regular Edison-type screw-in lamp socket supplied with high-frequency voltage.

Yet another object is that of providing for a power-line-operated power supply functional to provide high-frequency power to a lighting product even if the power line voltage were to be interrupted.

These as well as other objects, features and advantages of the present invention will become apparent from the following description and claims.

Brief Description of an Initially Preferred Embodiment

In an initially preferred embodiment, subject invention is an ordinary so-called table lamp (or floor lamp), except as follows:
 (a) it has a more flexible light-weight power cord, said power cord having a pair of conductors; and
 (b) it has a somewhat larger-than-normal power plug at the end of its power cord, said power plug having a pair of prongs for insertion into an ordinary household electrical receptacle and comprising the following assembly:
  a rectifier means connected with said pair of prongs and operative, whenever the power plug is inserted into the electrical receptacle, to provide a DC voltage output;
  an inverter connected with said DC voltage output and operative to provide an AC voltage output of 30 kHz frequency;
  a transformer connected in circuit with said AC voltage output and operative to provide a power-line-isolated low-magnitude ( 30 Volt RMS) high-frequency (30 kHz) voltage at a pair of output terminals, said pair of output terminals being connected with said pair of conductors in the light-weight power cord; and
  disable means connected in circuit with said pair of output terminals and operative to sense the magnitude of the output current drawn therefrom, said disable means being operative to disable the inverter in case this output current exceeds a pre-determined magnitude for more than a brief time-period;
  whereby the socket in the table lamp is provided with a power-line-isolated power-limited low-magnitude high-frequency AC voltage.

Also, the initially preferred embodiment includes a fluorescent lamp mounted on an ordinary Edison-type screw-base and adapted to be screwed into and powered from the lamp socket in the table lamp. This fluorescent lamp is self-ballasted for 30 kHz operation—with the ballast therefore being so small as to permit it to be contained substantially within the screw-base.

Brief Description of the Presently Preferred Embodiment

In the presently preferred embodiment, the invention includes the following key elements.
 (a) A power supply is plugged into an ordinary household electrical outlet and is functional to provide a high frequency current at a power receptacle operative to receive the power plug of an ordinary table lamp.
 (b) This ordinary table lamp has a special compact fluorescent lamp screwed into its lamp socket.
 (c) Provided the special fluorescent lamp is indeed screwed into the lamp socket, and provided the lamp's switch is in its ON position, the power supply does in fact supply the high frequency current from its power receptacle.
 (d) The high frequency current powers the compact special fluorescent lamp at a predetermined power level, thereby to provide for high-efficacy luminous output.
 (e) A storage battery contained within the special power supply [or, in an alternative version, located outside of and plug-in-connected with the special power supply] is kept fully charged by current derived from the power line voltage normally present at the electrical outlet and functions such as to cause high frequency current to be supplied from the output receptacle even if the power line voltage were to be disrupted.
 (f) To prolong the duration over which the battery can power the fluorescent lamp to a useful light output level, the magnitude of the power provided to the lamp during power failure may be reduced compared with the predetermined level.

BRIEF DESCRIPTION OF THE DRAWINGS

FIG. 1 schematically illustrates a table lamp according to the initially preferred embodiment of the invention.

FIGS. 2, 2a schematically illustrate the inverter-type power supply comprised within the power plug on the end of the power cord of the table lamp of FIG. 1.

FIG. 3, 3a schematically illustrate a high-frequency-ballasted screw-in fluorescent lamp suitable for direct insertion and operation in the lamp socket of the table lamp of FIG. 1.

FIG. 4 schematically illustrates a first version of the presently preferred embodiment of the invention.

FIG. 6 schematically illustrates the compact screw-in fluorescent lamp used in the embodiment of FIG. 4.

FIG. 7 schematically illustrates a modification of the first version illustrated in FIG. 4.

DESCRIPTION OF THE INITIALLY PREFERRED EMBODIMENT

Figure 5:
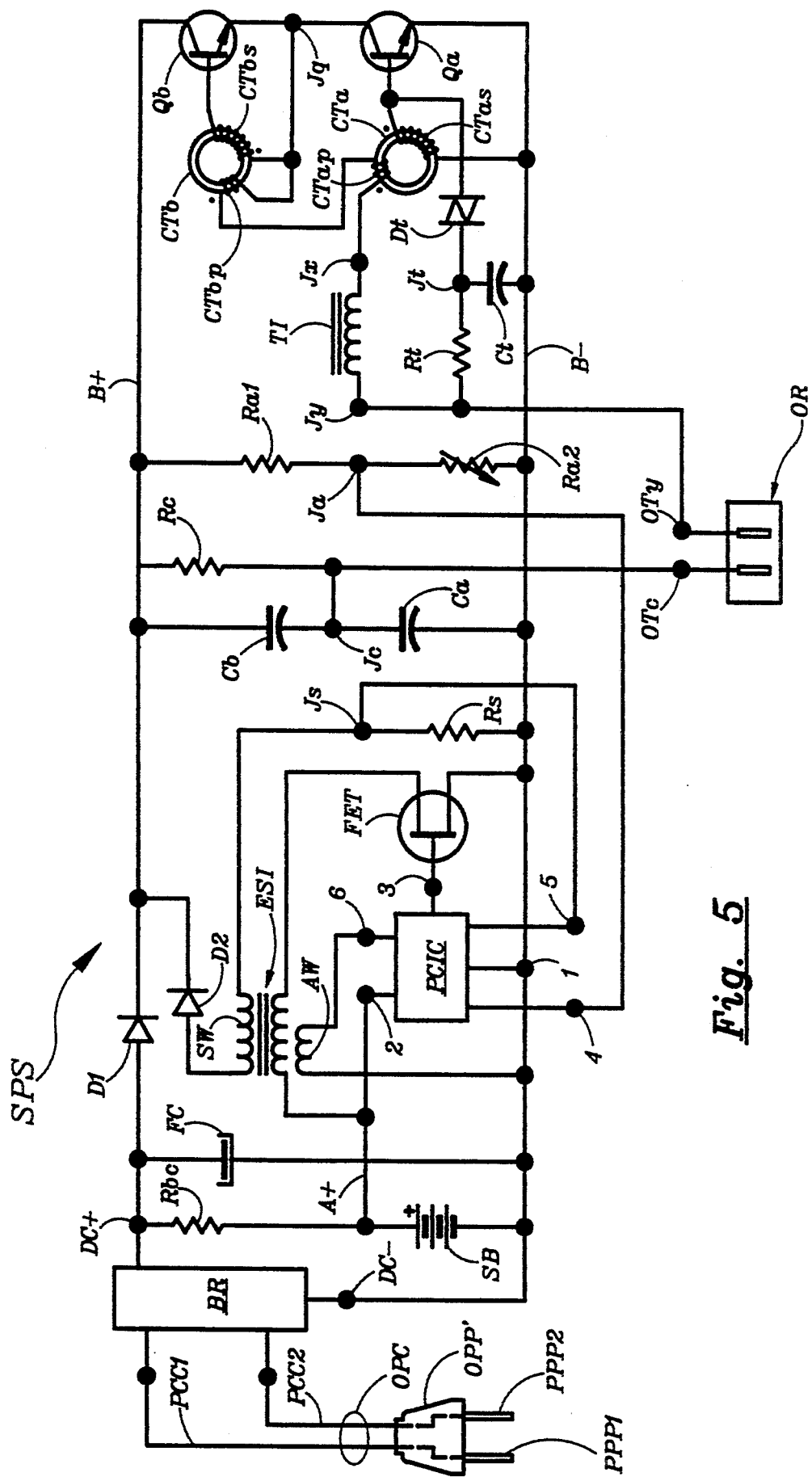
FIG. 5 schematically illustrates the power supply used in the embodiment of FIG. 4.

Details re Construction of Initially Preferred Embodiment

FIG. 1 shows an ordinary so-called table lamp TL with a two-conductor power cord PC. At the end of this power cord is mounted a somewhat-larger-than-normal power plug PP. This power plug, which comprises electronic circuitry in accordance with the schematic illustration of FIG. 2, is plugged into an ordinary household electrical receptacle ER.

The table lamp has an Edison-type screw-in lamp socket LS, into which is screwed a high-frequency-ballasted U-shaped fluorescent lamp UL of the type schematically illustrated in FIG. 3.

FIG. 2 schematically illustrates the power plug PP, which comprises a case or container means C on which is rigidly mounted a pair of electrical terminal prongs P1 and P2, which prongs are adapted for insertion into an electrical receptacle, such as ER of FIG. 1.

A circuit breaker CB is connected with a first terminal CB1 to prong P1 and with a second terminal CB2 to prong P2. A rectifier means R is connected with its two input terminals, R2 and R1, respectively, with prong P2 and a third terminal CB3 on circuit breaker CB.

The DC output voltage from R is applied to an inverter I; the output from which is, in turn, applied to the primary winding Tp of a ferrite transformer T. The output from this transformer's secondary winding Ts is applied to the power cord PC by way of primary winding CTp of current transformer CT.

The output from the secondary winding CTs of current transformer CT is applied to control terminals CBx and CBy of circuit breaker CB.

Details of circuit breaker CB are illustrated in FIG. 2a, where is shown a bi-stable bi-metallic bender/contactor BC connected with terminal CB1 and a stationary contactor SC connected with terminal CB3. This circuit breaker is shown in its unactivated position, which is a normally-closed position.

Two resistive heating elements HE1 and HE2 are thermally connected with the bender/contactor. Heating element HE1 is connected directly between terminals CB1 and CB2; and heating element HE2 is connected directly with control terminals CBx and CBy.

FIG. 3 illustrates a U-shaped fluorescent lamp UL mounted on a regular Edison-type screw-base SB. Mounted within this screw-base is B a high-frequency fluorescent lamp ballasting arrangement BA, details of which are schematically illustrated in FIG. 3a.

In FIG. 3a, connected between terminal SB1 of screw-base SB and cathode terminal Ca1 of fluorescent lamp UL is a tank-inductor TI. A tank-capacitor TC is connected between cathode terminals Ca2 and Cb2. Cathode terminal Cb1 is connected directly with screw-base terminal SB2.

Details re Operation of Initially Preferred Embodiment

The operation of the table lamp means TL of FIG. 1 is completely analogous to that of any ordinary table lamp, except that this particular table lamp is provided with a special power plug PP; which special power plug provides for a 30-Volt/30-kHz current-limited AC voltage to be supplied to its lamp socket LS—as contrasted with the 120-Volt/60-Hz non-current-limited AC voltage normally provided for such lamp sockets. Thus, lamps (light-bulbs) to be used with table lamp TL—whether they be incandescent or gas-discharge lamps—must be adapted to operate properly with this special 30-Volt/30-kHz AC voltage.

For instance, the fluorescent lamp of FIG. 3 is adapted to operate properly in the socket of the table lamp of FIG. 1. This fluorescent lamp is intended for proper operation on a 30-Volt/30-kHz AC voltage; and it is ballasted by way of resonant interaction between a tank-inductor TI and a tank-capacitor TC, which inductor and capacitor are resonant at 30 kHz.

(Due to the so-called Q-multiplication of resonant circuits, it is readily possible—without use of transformer means—to properly operate relatively high-voltage fluorescent lamps from relatively low-voltage supplies.)

In a general sense, resonant ballasting of fluorescent lamps is described in published literature and need not be described in further detail herein. However, its application to a self-contained screw-in fluorescent lamp is not previously described, and offers at least one particularly attractive feature, as follows.

If the lamp of FIG. 3 be screwed into a lamp socket with the normal 120-Volt/60-Hz non-current-limited voltage applied thereto, it will not be damaged in that the tank capacitor acts as a very high impedance for 60-Hz current.

The operation of the high-frequency (30 kHz) power supply comprised within the power plug PP is substantially conventional, except as follows.

The circuit breaker is of a bi-stable kind and normally provides for direct contact between prong P1 and terminal R1 of rectifier R; which then provides for power to sustain operation of the inverter I.

Heating element HE1 is powered directly from the full line voltage; but the amount of heat generated by HE1 is insufficient by itself to open the contact between bender/contactor BC and stationary contactor SC. However, due to the bi-stable nature built into the bimetallic bender/contactor, the amount of heat generated by HE1 is sufficient to keep BC from re-contacting with SC once the two have been separated.

Thus, to cause circuit breaker CB to open in the first place, it is necessary that enough additional heat be furnished by heating element HE2; and, by way of routine design procedures, it has been arranged for enough additional heat to be furnished by HE2 at the point when the current flowing from power plug PP to power cord PC exceeds a chosen safe limit—which limit was chosen to be 3.3 Ampere in this preferred embodiment.

The main purpose of transformer CT is that of providing for effective electrical isolation between the power line and the output of PP.

Of course, if heating element HE2 is well isolated from bender/contactor BC, proper power-line-isolation can be attained without the need of transformer CT.

Additional Comments re Initially Preferred Embodiment (a) Due to the resonant ballasting method, the current drawn by the fluorescent lamp of FIG. 3, when used in the table lamp of FIG. 1, is substantially sinusoidal and in phase with the fundamental component of the square-wave voltage provided from the plug-mounted power supply.

(b) It should be noted that a lighting product powered by way of the special cord-and-plug arrangement illustrated in FIGS. 1 and 2 can have any number of lamp sockets and operate with any number of fluorescent and/or incandescent lamps—the only limitation being that the total amount of power drawn not exceed the capacity of the plug-mounted power supply.

DESCRIPTION OF THE PRESENTLY PREFERRED EMBODIMENTS

Details re Construction of Presently Preferred Embodiments

FIG. 4 schematically illustrates a first version of the presently preferred embodiment.

In Fig. 4, an ordinary table lamp OTL has an ordinary lamp socket OLS with an ON/OFF switch OOS and an ordinary power cord OPC at the end of which is an ordinary power plug OPP adapted to plug into any ordinary household electric receptacle, such as OHER.

A special power supply SPS has a power input cord PIC at the end of which is an ordinary power plug OPP' plugged into ordinary household electrical receptacle OHER. Special power supply SPS also has an output receptacle OR into which ordinary power plug OPP is plugged.

A special compact fluorescent lamp SCFL has a lamp base LB screwed into ordinary lamp socket OLS.

FIG. 5 schematically illustrates the special power supply SPS used in the arrangement of FIG. 4.

In Fig. 5, ordinary power cord OPC is shown to have power cord conductors PCC1 and PCC2 connected respectively with power plug prongs PPP1 and PPP2 of ordinary power plug OPP'; which is actually plugged into ordinary household electrical receptacle OHER of FIG. 4.

Power cord conductors PCC1/PCC2 are connected with the AC input terminals of a bridge rectifier BR, which has a pair of DC output terminals DC− and DC+ connected respectively with a B− bus and the anode of a diode D1, whose cathode is connected with a B+ bus. A filter capacitor FC is connected between the DC− terminal and the DC+ terminal.

A first capacitor Ca is connected between the B− bus and a junction Jc; and a second capacitor Cb is connected between junction Jc and the B+ bus. A first transistor Qa is connected with its emitter to the B− bus and with its collector to a junction Jq; to which junction Jq is connected the emitter of a second transistor Qb, whose collector is connected with the B+ bus.

Primary windings CTap and CTbp of current transformers CTa and CTb, respectively, are series-connected between junction Jq and a junction Jx. The terminals of secondary winding CTas of current transformer CTa are connected across the base and the emitter of transistor Qa; while the terminals of secondary winding CTbs of current transformer CTb are connected across the base and the emitter of transistor Qb.

A tank inductor TI is connected between junction Jx and a junction Jy; which junction Jy is connected with output terminal OTy; which output terminal OTy represents one of the output terminals of output receptacle OR; whose other output terminal is OTc, which is connected to junction Jc. A resistor Rc is connected between junction Jc and the B+ bus.

A resistor Rt is connected between junction Jy and a junction Jt; a capacitor Ct is connected between junction Jt and the B− bus; and a Diac Dt is connected between junction Jt and the base of transistor Qa.

A storage battery SB is connected with its negative terminal to the B− bus and with its positive terminal to an A+ bus. An energy-storing inductor ESI is connected between the A+ bus and the drain terminal of a field effect transistor FET, whose source terminal is connected with the B− bus. A secondary winding SW, which is tightly coupled with energy-storing inductor ESI, is connected between a junction Js and the anode of a diode D2, whose cathode is connected with the B+ bus. A resistor Rs is connected between junction Js and the B− bus.

A resistor Ra1 is connected between junction Ja and the B+ bus; and an adjustable resistor Ra2 is connected between junction Ja and the B− bus. Also, a resistor Rbc is connected between the DC+ terminal and the A+ bus.

A pre-converter integrated circuit PCIC has terminals 1 through 6, of which: terminal 1 is connected with the B− bus; terminal 2 is connected with the A+ bus; terminal 3 is connected with the gate terminal of transistor FET; terminal 4 is connected with junction Ja; terminal 5 is connected with junction Js; and terminal 6 is connected with one terminal of an auxiliary winding AW on energy-storing inductor ESI. The other terminal of auxiliary winding AW is connected with the B− bus.

FIG. 6 schematically illustrates the special compact fluorescent lamp SCFL of FIG. 4.

In FIG. 6, screw-base SB' has a first base terminal BT1' and a second base terminal BT2', with which base terminals are connected lamp terminals LT1 and LT2, respectively.

A tank capacitor TC' and a resistor Rt' are connected between lamp terminals LT1 and LT2.

A special fluorescent lamp SFL has thermionic cathodes TC1 and TC2; which thermionic cathodes are connected with lamp terminals LT1 and LT2, respectively.

For sake of clarity, special fluorescent lamp SFL is shown as if it were folded-out flat, thereby to permit seeing the complete path of gas discharge current flow. However, in reality, special fluorescent lamp SFL is "folded-up"; which, more particularly, means that it consists of two interconnected Biax lamps disposed in such manner that each of the four tubular lamp portions is located at a different corner of a square.

FIG. 7 schematically illustrates a modification of the first version of the preferred embodiment; which first version is shown in FIG. 4.

The arrangement of FIG. 7 is identical to that of FIG. 4, except as follows:

Since it no longer needs to house storage battery SB, the housing of special power supply SPS of FIG. 4 has been made far smaller and has been integrated with ordinary power plug OPP', thereby to form an integral combination of special power supply SPS and power plug prongs PPP1/PPP2; which integral combination is now referred to as special power supply SPS'. In other words, ordinary power plug OPP' of FIG. 4 has been made an integral part of the reduced-size power supply housing and is used for supporting this housing when plugged into household electrical receptacle OHER.

That is, the circuitry of special power supply SPS' of Fig. 7 is identical to that of special power supply SPS of FIG. 5, except that it does not include a built-in storage battery (e.g., SB) as does special power supply SPS of FIG. 5. Instead, special power supply SPS' includes an auxilary receptacle means ARM1 having a pair of auxiliary receptacle terminals connected with the B− bus and the A+ bus.

Instead of built-in storage battery SB of the FIG. 4 arrangement, the arrangement of FIG. 7 has a special storage battery SSB mounted externally. Special storage battery SSB has a special receptacle means SRM2; which special receptacle means has a pair of receptacle terminals connected with a pair of battery terminals within special storage battery SSB.

Plug-in connection between special power supply SPS' and special storage battery SSB is effectuated by means of a flexible connect cord FCC; which has a plug-means at each end.

Figure 8:
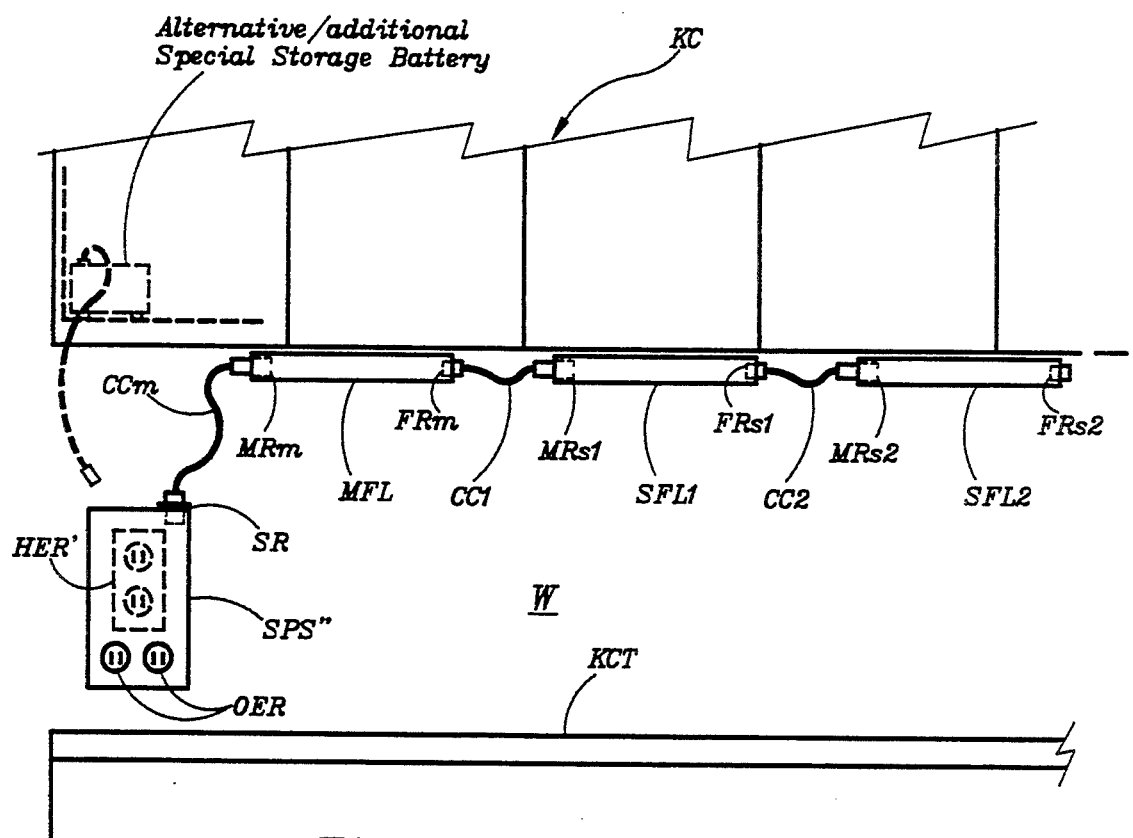
FIG. 8 schematically illustrates a second version of the presently preferred embodiment.

FIG. 8 schematically illustrates a second version of the presently preferred embodiment of the invention.

In FIG. 8, a special power supply SPS" is shown mounted on a wall W behind a kitchen counter top KCT and below a number of kitchen cabinets KC.

Special power supply SPS" is shown mounted in such a way as to completely cover ordinary home electrical receptacle HER', which is shown in phantom outline.

On the face of special power supply SPS" is located a pair of ordinary electrical receptacles OER; while on top of special power supply SPS" is located a special two-terminal recessed receptacle SR.

Except for the following features, special power supply SPS" is substantially identical to special power supply SPS of the arrangement of FIG. 4:
(i) instead of powering the fluorescent lamp means from an ordinary household-type receptacle (OR in FIG. 4), the fluorescent lamp means of FIG. 8 is powered from SPS" by way of a special recessed receptacle (SR);
(ii) SPS" has a pair of ordinary household-type electric receptacles OER, each of which is electrically connected (by connect means disposed inside of SPS"—not expressly shown) with one of the receptacles of the household electrical receptacle (HER') over which SPS" is mounted and into which SPS" is plugged (by means not expressly shown); and
(iii) SPS" includes means (not expressly shown) by which it can be flush-mounted on a wall in such manner as to cover an ordinary wall electrical receptacle, while at the same time having a power plug (not expressly shown) operative to plug into one of the receptacles of this wall electrical receptacle.

A master fluorescent lamp MFL as well as slave fluorescent lamps SFL1 and SFL2 are mounted on a flat surface underneath kitchen cabinets KC. Master fluorescent lamp MFL has a two-terminal recessed male receptacle MRm at its one end and a two-terminal self-shorting female receptacle FRm at its other end. Slave fluorescent lamp SFL1 has a two-terminal recessed male receptacle MRs1 at its one end and a two-terminal self-shorting female receptacle FRs1 at its other end; and slave fluorescent lamp SFL2 has a two-terminal recessed male receptacle MRs2 at its one end and a self-shorting female receptacle FRs2 at its other end.

Connection between special receptacle SR and male receptacle MRm is effectuated by connect cord CCm, which has a plug means at each end; connection between female receptacle FRm and male receptacle MRs1 is effectuated by connect cord CC1, which also has a plug means at each end; and connection between female receptacle FRs1 and male receptacle MRs2 is effectuated by connect cord CC2, which likewise has a plug means at each end. Each plug means is commensurate with the receptacle into which it is to be inserted.

Figure 9:
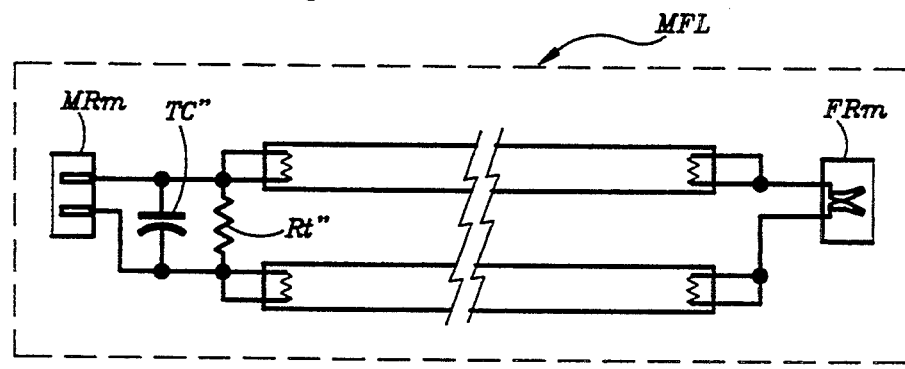
FIG. 9 schematically illustrates the master lamp used in the embodiment of FIG. 8.

FIG. 9 schematically illustrates master fluorescent lamp MFL of FIG. 8.

In FIG. 9, master fluorescent lamp MFL is shown to consist of two separate fluorescent lamps series-connected with each other by way of a normally-shorted switch means integrally combined with a female receptacle means, which switch-receptacle combination is identified by the symbol FRm. Each of the two non-shorted ends of the two separate fluorescent lamps is connected with one of the prongs in the two-prong recessed male receptacle means MRm. Connected between the two non-shorted ends are a tank capacitor TC" and a resistor Rt".

Figure 10:
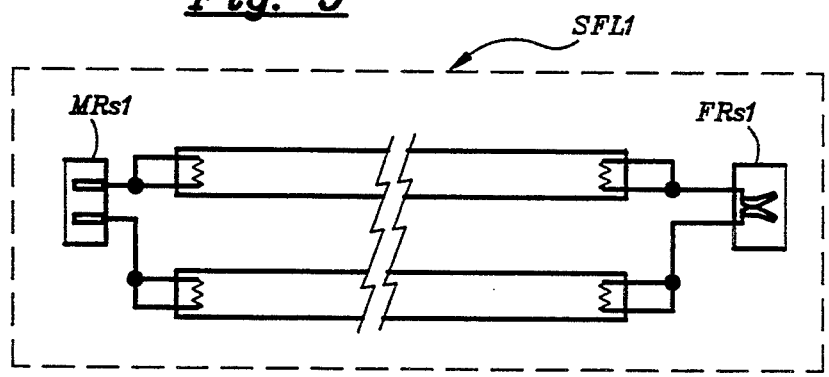
FIG. 10 illustrates one of the slave lamps used in the embodiment of FIG. 8.

FIG. 10 schematically illustrates slave fluorescent lamp SFL1 of FIG. 8.

In FIG. 10, slave fluorescent lamp SFL1 (which is identical to slave fluorescent lamp SFL2) is shown to consist of two separate fluorescent lamps series-connected with each other by way of a normally-shorted switch means integrally combined with a female receptacle means, which switch-receptacle combination is identified by the symbol FRs1. Each of the two non-shorted ends of the two separate fluorescent lamps is connected with one of the prongs in the two-prong recessed male receptacle means MRs1.

Details re Operation of Presently Preferred Embodiment

With reference to FIGS. 5 and 6, the operation of the first preferred embodiment of FIG. 4 may be explained as follows.

As long as ordinary 120 Volt/60 Hz power line voltage is indeed provided at receptacle OHER, a DC supply voltage of magnitude in excess of about 140 Volt will be present between the B— bus and the B+ bus in special power supply SPS (see the circuit arrangement of FIG. 5). With the DC supply voltage having a magnitude in excess of 140 Volt, the pre-converter IC (PCIC) will not be activated; which means that no power will be consumed by the pre-converter circuitry, which mainly consists of elements FET, PCIC, ESI and D2.

Thus, as long as power line voltage is indeed provided at receptacle OHER, the half-bridge series-resonant inverter ballast (which mainly consists of elements Qa, Qb, CTa, CTb, Ca, Cb, TI and TC', where TC' is part of screw-in compact fluorescent lamp SCFL) is powered from the power line voltage; which is to say that, when ON-OFF switch OOS is in its ON position and power line voltage is indeed present at receptacle OHER, compact screw-in fluorescent lamp CSFL is powered from the power line voltage. Moreover, as long as power line voltage is provided, storage battery SB will be charged at a relatively low rate by way of resistor Rbc.

However, in case of power failure, the magnitude of the DC supply voltage will fall below 140 Volt; and, as soon as this magnitude falls below 140 Volt by some relatively small amount (e.g., by 20 Volt), pre-converter PCIC will be activated; which, in turn, will cause the magnitude of the DC supply voltage to be maintained at some lower pre-determined level (e.g., 130 Volt), but only as long as the magnitude of the voltage present between the B— bus and the A+ bus remains above a certain minimum level (e.g., 10 Volt). Thus, as long as the magnitude of the voltage supplied by storage battery SB remains higher than this certain minimum level (10 Volt), the magnitude of the inverter's DC supply voltage (i.e., the voltage provided between the B-bus and the B+ ) bus will be maintained at the lower predetermined level (130 Volt); which therefore will cause lamp CSFL to continue to provide luminous output even if the power line voltage were to be removed from receptacle OHER.

In light of the functional description provided hereinabove, combined with well known prior art and the description herein of the Initially Preferred Embodiment, a person possessing ordinary skill in the particular art pertinent hereto will readily understand the details of the operation of special power supply SPS of FIG. 5 and compact screw-in fluorescent lamp CSFL of FIG. 6.

The arrangement of FIG. 7 is substantially equivalent to that of FIG. 4, except for having made the storage battery an external element (connectable with the special power supply (SPS') by way of a simple flexible connect cord FCC), thereby readily permitting storage battery SSB (in case it were to have become discharged) to be substituted with another storage battery or even with a primary battery. Clearly, the arrangement of Fig. 7 has utility when supplied/used without a battery, but has the added value of permitting at any time the addition of a battery.

Thus, for reasons of economy, a person may initially purchase nothing more than the plug-mounted power supply (SPS') and the screw-in compact fluorescent lamp (SCFL), and then—at some later date—purchase either a large or small special storage battery (e.g., SSB), and/or a large or small primary battery, combined with a flexible connect cord (FCC) suitable for connection between auxiliary receptacle means ARM1 and whatever connect means (e.g., SRM2) be provided by or in connection with the storage and/or primary battery.

With reference to FIGS. 9 and 10, the operation of the second version of the presently preferred embodiment, which is illustrated by FIG. 8, is explained as follows.

The operation of special power supply SPS" is substantially identical to that of the first version of the presently preferred embodiment; and the operation of master fluorescent lamp MFL is substantially identical to that of screw-in compact fluorescent lamp SCFL of FIG. 6. As one (or more) slave fluorescent lamp(s) is plugged into receptacle FRm of lamp MFL, the operation of the resulting series-combination of lamps remains substantially identical to that of lamp SCFL of FIG. 6.

The maximum number of lamps that may be series-connected this way depends on: (i) the magnitude of the ignition voltage of each individual lamp; (ii) the total number of individual lamps; and (iii) the magnitude of the ignition voltage provided from output receptacle SR of special power supply SPS".

Additional Comments re Presently Preferred Embodiment (a) It is emphasized that for OEM applications the arrangement of FIG. 4 should be modified such that special power supply SPS be comprised within the body of ordinary table lamp OTL. The result would then be a table lamp: (i) having an integral special power supply with built-in energy-storage means; (ii) being adapted to be plugged directly into an ordinary household electrical receptacle; and (iii) being functional such as to continue to provide light even in the event of a power failure.

(b) With respect to the arrangement of FIG. 8, each of connect cords CC1/CC2 is so constituted as to have: (i) at its one end, a female plug operative to plug into one of the recessed male receptacles MRs1/MRs2; and (ii) at its other end, a male plug operative to plug into one of female receptacle means FRm/FRs1/FRs2.

With reference to FIG. 10, the male plug intended to be plugged into exemplary female receptacle FRs1 has two terminals and is constituted such that, upon insertion into receptacle FRs1, it forces the two normally-connected terminals of FRs1 apart while at the same time causing each of its two terminals to make electrical connection with one of the two terminals of receptacle FRs1.

(c) It is emphasized that the screw-in compact fluorescent lamp of FIG. 3 has a screw-base within which is mounted several electronic components (i.e., ballast assembly BA); which is to say, the screw-base is used as a housing for at least a part of the circuitry required for ballasting the fluorescent lamp, thereby permitting the rest of the complete lamp assembly to be more compact.

Similarly, the screw-in compact fluorescent lamp of FIG. 6 has some of its electronic components comprised within the screw-base.

(d) In situations where it be necessary to provide electrical isolation between the power line and the terminals connected with the storage battery—such as with the arrangement of FIG. 7—battery charging is accomplished by way of an isolated auxiliary winding on tank inductor TI; the output from which auxiliary winding is full-wave-rectified and supplied to output receptacle ARM1 by way of a smoothing inductor.

(e) For some applications, it is advantageous to provide special power supply SPS" of FIG. 8 in the form of a cord-connected stand-alone power supply, such as special power supply SPS of FIG. 4.

(f) In the various screw-in compact fluorescent lamp assemblies (e.g., the one illustrated by FIG. 3), it is important to arrange for the fluorescent lamp itself (e.g., UL in FIG. 3) to require an ignition voltage of magnitude substantially higher than that of the power line voltage usually provided in an ordinary Edison-type lamp socket. That way, if one of these screw-in compact fluorescent lamps were to be screwed into an ordinary live lamp socket, it would not ignite and no detrimental results would occur.

(g) Similarly, it is important that no damage result in case some load with an ordinary electric power plug were to be plugged into ordinary output receptacle OR of FIG. 4.

As long as special power supply SPS includes circuitry like that of FIG. 5, no damage is likely to result.

In fact, even if a short circuit were to be applied to receptacle OR, only a modest amount of high-frequency current would be flowing through this short circuit.

More particularly, any resistive load connected with receptacle OR would be subjected to a high-frequency squarewave voltage of RMS magnitude equal to about 80 Volt modified by the fact that this squarewave voltage is fed to the receptacle terminals though tank inductor TI; which will cause any resulting current to be manifestly limited in magnitude.

(h) In the arrangement of FIG. 7, different sizes of special storage batteries SSB may be used. The particular size (or amp-hr capacity) preferable in a given application would depend on the details of the particular circumstances associated with that given application.

Also, it is important to realize that a primary battery (e.g., two series-connected 6 Volt lantern batteries) may be used instead of the indicated storage battery.

(i) The power required to power one of the screw-in compact fluorescent lamps (e.g., SCFL) may expectedly be anywhere from about 5 Watt to about 25 Watt. For many typical applications, a power level associated with full light output from the screw-in compact fluorescent lamp will be about 12 Watt. Similar power levels pertain with respect to the master and/or slave fluorescent lamps associated with the arrangement of FIG. 8.

In other words, with reference to the arrangements of FIGS. 4, 7 and 8, a 12 Volt storage battery of 1 Amp-Hour capacity would be able to power a 12 Watt fluorescent lamp for nearly one hour at full light output; which implies that it would provide half-of-full light output for more than two hours.

(j) In some circumstances, the external battery arrangement of FIG. 7 may advantageously be applied to the under-the-cabinet lighting system of FIG. 8, in which case the special external storage (or primary) battery would preferably be located within one of the indicated cabinets—with connect cord CCm being connected between the external storage battery (e.g., SSB of FIG. 7) and the special power supply (e.g., SPS' of FIG. 7) by way of a small opening drilled in the floor of the cabinet.

(k) It is noted that resistor Ra2 of FIG. 5 is indicated as being adjustable.

By adjusting the magnitude of the resistance of Ra2, the magnitude of the DC supply voltage developed at the B+ bus (as referenced to the B− bus) will be adjusted correspondingly in the sense that: the higher the resistance of Ra2, the lower the magnitude of the DC supply voltage developing at the B+ bus.

Thus, in case of power failure, the magnitude of the light provided by whatever lamp be powered from the inverter power supply of FIG. 5 will be adjusted by adjusting the magnitude of the resistance of adjustable resistor Ra2.

I claim:

1. An arrangement comprising:
a first assembly characterized by including the following interconnected elements:
a first element, which includes a power plug having electrical prongs plugged into an ordinary household electrical receptacle, thereby to be connected with the power line voltage normally provided thereat;
a second element, which includes a rectification means and is operative to provide an output of unidirectional voltage;
a third element, which includes an energy-storing sub-assembly and is operative: (i) to receive electrical energy from the power line voltage provided at the electrical receptacle, when such power line voltage is indeed provided thereat; and (ii) to store at least a part of the energy so received in the form of an electrical charge; and
a fourth element, which includes an electronic sub-assembly operative to provide an AC output voltage at an AC output receptacle and to draw energy: (i) from the power line voltage normally provided at the electrical receptacle, as long as the power line voltage is indeed so provided; or (ii) whenever the power line voltage is not so provided, from the energy-storing sub-assembly;
a second assembly having an AC power plug plugged into the AC output receptacle and otherwise characterized by including a lamp socket having socket terminals connected with the AC power plug and functional to receive and hold an ordinary household electrical light bulb having a screw-base, thereby to provide the AC output voltage at the socket terminals; and
a third assembly having a screw-base inserted into and held by the lamp socket and otherwise characterized by: (i) including a pair of base terminals and a fluorescent lamp with a pair of lamp terminals connected with the base terminals; and (ii) being functional to provide luminous output of substantive magnitude.

2. The arrangement of claim 1 wherein the third assembly is additionally characterized by including an electronic-type component within the screw-base.

3. The arrangement of claim 1 wherein, even if the power line voltage were to be removed from the electrical receptacle: (i) the energy-storing sub-assembly would continue to supply energy to the electronic sub-assembly for a period of some minimum duration; and (ii) the third assembly would continue to provide luminous output of substantive magnitude during said period.

4. The arrangement of claim 3 wherein the minimum duration is defined to be at least fifteen minutes.

5. The arrangement of claim 1 wherein the electronic sub-assembly of the fourth element of the first assembly is further characterized by including adjustment means operative to permit adjustment of the amount of power drawn from the energy-storing sub-assembly during periods whenever the power line voltage is not provided at the electrical receptacle.

6. An arrangement comprising:
(1) a special power supply characterized by:
(a) having a plug means adapted to be plugged into an ordinary household electrical receptacle and, when indeed plugged into such an electrical receptacle whereat is provided an ordinary power line voltage, being operative to draw electric power therefrom;
(b) electrical circuitry characterized by: (i) having a main receptacle with a pair of main receptacle terminals, the main receptacle being capable of receiving and holding a plug of a type adapted to be plugged into and held by an ordinary household electrical receptacle; and (ii) being operable to provide an AC voltage at the main receptacle terminals; and
(c) a pair of auxiliary terminals between which exists, at least at certain times, an auxiliary voltage; and
(2) a rechargeable battery means having a pair of battery terminals disconnectably connected with the auxiliary terminals; thereby, at least during certain periods, to draw charging power therefrom; and
(3) a light-producing means characterized by: (i) including a flexible power cord having a male power plug inserted into the main receptacle, thereby to draw AC power therefrom; and (ii) having a fluorescent lamp operative to emit light whenever the male power plug is indeed drawing AC power from the main receptacle.

7. The arrangement of claim 6 further characterized in that, in case the power line voltage be removed from the electrical receptacle, the rechargeable battery be operable to supply current to the auxiliary terminals, thereby causing the special power supply to continue to supply an AC voltage at the main receptacle terminals, thereby to cause the fluorescent lamp to emit light even during times when the special power supply does not draw electric power from the electrical receptacle.

8. The arrangement of claim 6 wherein the light-producing means is further characterized by including:
(a) a lamp base to which the flexible cord is attached;
(b) a lamp socket mounted on the lamp base and having a pair of socket terminals electrically connected with the flexible power cord; the lamp socket being adapted to receive and hold an ordinary household-type electric light bulb; and
(c) a screw-in lamp structure having a screw-base with a pair of screw-base terminals; the screw-in lamp structure being screwed into the lamp socket, thereby to cause the screw-base terminals to connect with the socket terminals; the screw-in lamp structure including the fluorescent lamp, which has lamp terminals electrically connected with the screw-base terminals.

9. The arrangement of claim 6 further characterized in that the special power supply includes an auxiliary receptacle means connected with the auxiliary terminals and adapted to receive a special plug means; the auxiliary receptacle means being of such construction as not to permit insertion of an electrical power plug of the type adapted to plug into an ordinary household electrical receptacle.

10. The arrangement of claim 6 additionally characterized in that the electrical circuitry includes a safety feature whereby the AC voltage will be present at the main receptacle terminals only as long as an appropriate load is connected therewith; the light-producing means constituting such an appropriate load.

11. The arrangement of claim 6 additionally characterized in that the special power supply is comprised within a housing that is integrally combined with the plug means; such that, when the plug means is indeed plugged into the electrical receptacle, the housing in rigidly supported thereby.

12. An arrangement comprising:
(1) a power supply means characterized by:
 (a) including a pair of conductive prongs penetrating into a pair of receptacle slots of an electrical receptacle mounted on a wall; the electrical receptacle having a pair of receptacle terminals at which is normally provided a power line voltage;
 (b) being so constituted and mounted as to cover the electrical receptacle;
 (c) having at least one output receptacle into which may be plugged an electrical power plug of a type operative to be plugged into an ordinary household electrical receptacle; the output receptacle having a pair of receptacle terminals connected with the conductive prongs;
 (d) including electronic circuitry operative to draw power from the electrical receptacle during periods when the power line voltage is present thereat; and
 (e) special output terminals connected with the electronic circuitry and operative to supply an AC voltage to a special load; and
(2) a lamp means having lamp terminals connected with the special output terminals; the lamp means being operative to constitute said special load.

13. The arrangement of claim 12 wherein the power supply means is further characterized by being included within a housing having mounting means functional to permit its fastening to the wall.

14. The arrangement of claim 12 wherein the lamp means is further characterized by including a fluorescent lamp.

15. The arrangement of claim 12 wherein the special power supply means is further characterized by: (i) including an electric storage battery; and (ii) being operable to supply the AC voltage to the special load even if the power line voltage were to be removed from the electrical receptacle.

16. The arrangement of claim 12 wherein the special power supply means includes a sub-circuit functional such as not to provide the AC voltage at the special output terminals except when the special load is in fact connected therewith.

17. The arrangement of claim 12 wherein the lamp means is further characterized by: (i) including plural lamp sets, each lamp set including at least one fluorescent lamp; and (ii) connect means functional to connect the plural lamp sets in series with each other across the lamp terminals.

18. The arrangement of claim 17 wherein at least one of the plural lamp sets has a lamp receptacle means operate to receive and releaseably hold a plug means which, in turn, is connected with another lamp set.

19. The arrangement of claim 12 additionally comprising:
(3) a structure mounted on the wall above the electrical receptacle; the structure having a substantially horizontal surface underneath which is mounted at least a part of the lamp means.

20. An arrangement comprising:
(a) a lamp structure having: (i) a lamp socket adapted to receive and hold an ordinary household electrical light bulb, the lamp socket having a pair of socket terminals; and (ii) a power cord having a pair of power conductors and a power plug of a type operable to be plugged into an ordinary household electrical receptacle; the power conductors being connected with the socket terminals;
(b) a lamp assembly having a gas discharge lamp with a pair of lamp terminals as well as a lamp-base inserted into the lamp socket; the lamp-base having a pair of base terminals connected with the lamp terminals, thereby to cause the lamp terminals to be connected with the socket terminals; and
(c) a special power supply connected with the power line voltage of an ordinary electric utility power line; the special power supply having an AC receptacle at which is provided an AC voltage of frequency distinctly higher than that of the power line voltage; the power plug being plugged into the AC receptacle, thereby to cause the AC voltage to be applied across the lamp terminals.

21. The arrangement of claim 20 wherein the special power supply is further characterized by being operative to supply the AC voltage to the lamp terminals for a significant period of time even if it were to be disconnected from the power line voltage; a significant period of time being defined as being equal to about one minute or more.

* * * * *